June 26, 1962 N. GONCHAROFF 3,041,550
CRYSTAL OSCILLATOR CIRCUIT
Filed June 18, 1959
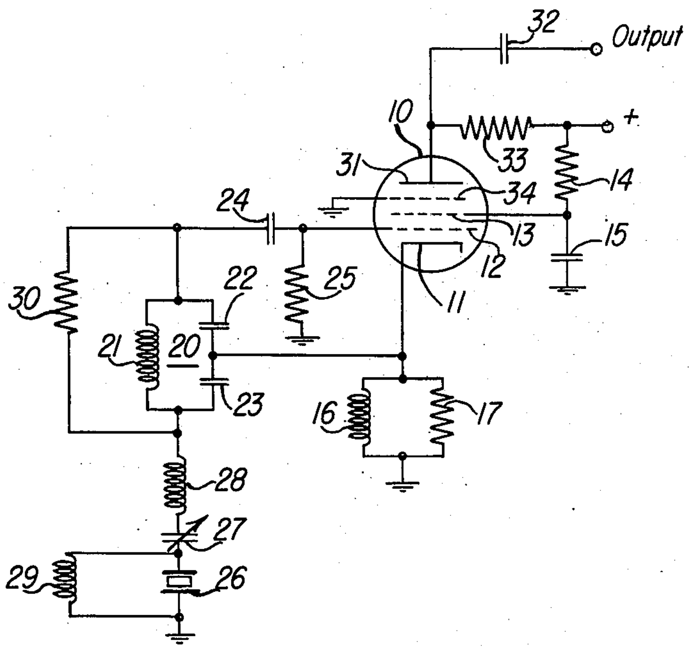
INVENTOR.
Nikolai Goncharoff
BY Mueller & Aichele
Attys.

3,041,550
CRYSTAL OSCILLATOR CIRCUIT

Nikolai Goncharoff, Chicago, Ill., assignor to Motorola, Inc., Chicago, Ill., a corporation of Illinois
Filed June 18, 1959, Ser. No. 821,161
5 Claims. (Cl. 331—73)

This invention relates generally to electronic oscillators and more particularly to highly stable oscillators utilizing crystals for determing the oscillator frequency.

In radio apparatus and other electronic equipment it is desired to provide oscillations which are held at extremely accurate frequencies. To accomplish this oscillators controlled by piezoelectric crystals have been used. While such oscillators have been quite effective, oscillators of simple construction have not been found to be sufficiently stable in the presence of variations in temperature and in supply voltage. The highly stable oscillators which are available have been difficult to change in frequency to compensate for the tolerances in the crystal units and other components. In many cases it is desired to provide an oscillator which can be used at different frequencies for different cannels in a communication system by changing the crystal, and oscillators which have the required stability have not been suitable for use at different frequencies.

It is therefore an object of the present invention to provide a simple and improved stable crystal oscillator circuit.

A further object is to provide an improved crystal oscillator circuit wherein the crystal operates at series resonance and the oscillator operates at an overtone of the crystal frequency.

A further object of the invention is to provide a crystal oscillator wherein the crystal operates at a very low drive level so that the oscillator is extremely stable.

Another object of the invention is to provide a stable crystal oscillator wherein the frequency can be varied from the crystal frequency to compensate for tolerances in the crystal unit.

Still another object of the invention is to provide a stable crystal oscillator circuit wherein the characteristics of the crystal and the drive level of the crystal can be easily checked when the crystal is connected in the oscillator circuit.

A feature of the invention is the provision of a crystal oscillator circuit in which the crystal is coupled to the oscillator tank circuit and the feedback for sustaining oscillations divides between two paths, one of which includes the crystal and the other of which is separate from the crystal, so that the required feedback can be provided while maintaining low crystal drive.

Another feature of the invention is the provision of a series mode overtone crystal oscillator circuit in which the crystal has one terminal connected to ground so that the crystal characteristics and operation in the circuit can be easily measured.

Another feature of the invention is the provision of a series resonant crystal oscillator circuit wherein the frequency determining tank circuit is shunted by resistance to lower the Q, with the resistance cooperating with the circuit to provide a low impedance feedback path through the crystal which cooperates with a second low impedance feedback path to provide a highly stable oscillator circuit.

The invention is illustrated in the accompanying drawing wherein the single FIGURE is a circuit diagram of the crystal oscillator circuit in accordance with the invention.

In practicing the invention there is provided an oscillator circuit including a tube of the pentode type. The cathode, control grid and screen grid are connected to form an oscillator with the anode being electron coupled and providing an output which is isolated from the oscillator elements. A crystal element has one terminal grounded, and a tank circuit is connected between the other terminal of the crystal and the control grid. A tap on the tank circuit is connected to the cathode which is connected to ground through an inductor and a resistor connected in parallel. The inductor has distributed capacitance to provide a high impedance at signal frequencies, and the resistor presents a controlled relatively low impedance to provide signal feedback therethrough to the cathode. Operating potential is applied to the screen grid which is bypassed to ground by the condenser which presents low impedance to the oscillator frequency. An inductor is bridged across the crystal to neutralize the same, and a capacitor and an inductor may be connected in series with the crystal to provide a variation in frequency of the oscillator. A resistor is bridged across the tank circuit to lower the Q of the tank circuit to render the oscillator more stable and to reduce the impedance of the feedback path through the tank circuit and the crystal.

The crystal is operated at series mode and the tank circuit is tuned to provide overtone operation. Feedback from the screen grid is applied through two paths, one including the crystal and the second including the cathode resistor, so that the required feedback current is provided with the drive level of the crystal being held at a desired low value. The cathode resistor is selected so that it does not provide sufficient feedback for oscillations and the oscillations are therefore controlled by the feedback through the crystal. In this manner the drive level of the crystal is held low, and the action of the oscillator is extremely stable.

Referring now to the drawing, there is shown the circuit diagram of the oscillator in accordance with the invention. A pentode tube 10 is illustrated, but it will be obvious that tubes of other types, or transistors, might be used to provide the active element of the oscillator. The cathode 11, control grid 12 and screen grid 13 of tube 10 form the active elements of the oscillator. Operating potential is applied to the grid 13 through resistor 14, and the grid is bypassed by capacitor 15. The cathode 11 is connected to ground through inductor 16 and resistor 17. The oscillator tank circuit 20 includes inductor 21 and capacitors 22 and 23, and is connected through coupling capacitor 24 to the grid 12. Resistor 25 provides the grid return. The crystal 26 is connected to ground and through variable capacitor 27 and inductor 28 to the tank circuit. Inductor 29 acts to neutralize the crystal. Resistor 30 is connected across the tank circuit to reduce the Q of the circuit and to reflect a low resistance across capacitor 23 as will be further explained.

The tank circuit 20 is tuned to an overtone of the crystal frequency so that oscillations are produced at a relatively high frequency while using a low frequency crystal which is more rugged and easily handled. For example, the crystal 26 may be resonant at 6 megacycles and the tank circuit 20 may be tuned to 18 megacycles. Oscillations are sustained at the overtone frequency of the crystal determined by the tank circuit. A feedback path extends from screen grid 13 to the ground or reference potential and divides with one path extending through resistor 17, and the second through crystal 26, condenser 27, coil 28 and condenser 23 to the cathode 11. Inductor 16 is chosen to have distributed capacity such that it is resonant at the oscillator frequency and therefore this presents a high impedance to signal frequencies. However, resistor 17 which bridges the inductor 16 is selected to provide a cathode circuit having a lower impedance to signal currents to provide a controlled amount of feedback to the cathode, which is not enough to sustain oscillations. The effective impedance across capacitor 23 resulting from resistor 30 is less than the impedance of the cathode circuit including inductor 16 and resistor 17. This makes it possible to provide the additional feedback required for oscillation through the crystal 26 while still maintaining a low drive level for the crystal. Resistor 30, by reducing the Q of the tank circuit, minimizes frequency change due to changes in the various elements of the tank circuit resulting from changes in temperature, aging, etc.

The crystal 26 has one terminal connected to ground potential and this makes it easy to check the crystal to determine its characteristics. The variations in the crystals resulting from manufacturing tolerances can be measured as well as the drive level of the crystal in the circuit. This is an important factor in providing satisfactory crystal oscillator operation.

In the circuit shown the output is taken from the anode 31 and applied through coupling capacitor 32 to a modulator or other device. Operating potential is applied to the anode 31 through resistor 33. The suppressor grid 34 of the tube is connected to ground to shield the oscillator elements from the output so that the oscillator output may be derived from the circuit without causing any effect on the oscillator operation because of changes in the load. This further contributes to the extremely high stability of the oscillator circuit.

As previously stated, in many applications it is desirable to be able to shift the resonant frequency of the crystal to compensate for manufacturing tolerances, or to provide slight changes in the oscillator frequency. The series capacitor 27 and the series inductor 28 make it possible to shift the resonant frequency of the crystal to provide such compensation. It is not essential that both an inductor and a capacitor be provided to shift the frequency, but by use of the two elements, with one being adjustable as shown, it is possible to shift the crystal frequency in either direction from its natural frequency resulting from its physical characteristics. This adjustment may compensate for variations in the crystal mounting which affect the natural resonant frequency of the crystal as well as for tolerances in the crystal element itself.

The following values for the components shown in the figure of the drawing have been found to provide a highly satisfactory oscillator for operation in the frequency range from about 18 to 20 megacycles.

| | |
|---|---|
| Tube **10** | Type 7056. |
| Resistor **14** | 27,000 ohms. |
| Capacitor **15** | 1,500 micromicrofarads. |
| Inductor **16** | 5.6 microhenries. |
| Resistor **17** | 220 ohms. |
| Inductor **21** | Tunable for 18 to 20 megacycle range. |
| Capacitor **22** | 33 micromicrofarads. |
| Capacitor **23** | 190 micromicrofarads. |
| Capacitor **24** | 24 micromicrofarads. |
| Resistor **25** | 15,000 ohms. |
| Crystal **26** | Series resonant at about 6 megacycles. |
| Capacitor **27** | 8 to 50 micromicrofarads. |
| Inductor **28** | 5.6 microhenries. |
| Inductor **29** | 10.5 microhenries. |
| Resistor **30** | 8,200 ohms. |
| Capacitor **32** | 30 micromicrofarads. |
| Resistor **33** | 5,600 ohms. |

The above values are merely representative of a particular circuit and are not to be considered as limiting the invention. It is to be pointed out that various different values can be used to provide the desire results for different frequencies and conditions of operation.

The oscillator circuit of the invention has been found to be highly satisfactory for use in mobile equipment which is subject to wide ranges in temperature and operating voltages. To provide stable operation throughout a wide temperature range an oven may be provided for the crystal. Satisfactory operation has been obtained through the temperature range from −30° C. to +80° C. by providing an oven for holding the crystal temperature constant within a few degrees at a temperature around 85° C. while the remaining components are subjected to the ambient temperature. Under such conditions the oscillator has changed in frequency only slightly, and the frequency has remained quite constant in the presence of temperature changes even though the oscillator frequency is warped through a relatively wide range by adjustment of capacitor 27.

The circuit has also been found to be highly stable when subjected to changes in the supply voltage. As stated above the oscillator may be used in mobile equipment wherein the supply voltage is obtained from the vehicle electrical system and this voltage varies through extremely wide ranges. The frequency of the oscillator has remained constant when both the plate voltage and the heater voltage have varied through substantial ranges.

The oscillator in accordance with the invention may be used in various different applications. For example, the oscillator may be used as the carrier wave source for a radio transmitter, and the oscillations may be applied to an amplitude or frequency modulator. The oscillator may also be used as the local oscillator of a superheterodyne receiver. The oscillator may also be used in equipments other than radio transmitters and receivers and is suitable for general application.

The oscillator in accordance with the invention is extremely simple so that it can be constructed at low cost. The design is such that component values are not critical and it is therefore ideally suited for mass production. The frequency can be varied from the natural resonant frequency of the crystal so that the crystal tolerances are not severe. As the characteristics and operation of the crystal can be easily checked after the crystal is in the circuit, it is possible to adjust for variations in characteristics of components to provide the desired performance. The crystal oscillator is extremely stable, with the variations being held to an extremely low value in the presence of wide variations in temperature and in operating voltage, as may occur in mobile applications.

I claim:

1. An oscillator including in combination, an electron device having an input electrode, an output electrode and a common electrode, a piezoelectric crystal device having a first terminal connetced to a point of reference potential and having a second terminal, variable reactance means connected to said second terminal for changing the series resonant frequency of said crystal device, tank circuit means resonant at an overtone of the series resonant frequency of said crystal device, said tank circuit means having a tap thereon, circuit means coupling said tank circuit between said reactance means and said input electrode and coupling said tap on said tank circuit to said common electrode, resistor means connecting said common electrode to the reference potential point, means for applying a potential to said output electrode of said device, means providing a low impedance to the overtone frequency connected between said output electrode and the reference potential point, with feedback being provided from said output electrode to said common electrode through a first path including said crystal device and said tank circuit means and through a second path including said resistor means, said tank circuit means including means in series with said crystal device providing an effective impedance having a value less than that of said resistor means.

2. An oscillator including in combination, an electron device having an input electrode, an output electrode and a common electrode, a piezoelectric crystal device having a first terminal connected to a reference potential and having a second terminal, an inductor and a variable capacitor connected in series to said second terminal for changing the series resonant frequency of said crystal device, tank circuit means resonant at an overtone of the series resonant frequency of said crystal device, said tank circuit means having a tap thereon, circuit means coupling said tank circuit in series with said crystal device, said inductor and said capacitor to said input electrode, said circuit means coupling said tap on said tank circuit to said common electrode, resistor means connecting said common electrode to the reference potential, means for applying a potential to said output electrode of said device, and means providing a low impedance to the overtone frequency connected between said output electrode and the reference potential, with feedback being provided from said output electrode to said common electrode through a first path including said crystal device and said tank circuit means and through a second path including said resistor means.

3. An oscillator circuit including in combination, an electron device having an input electrode, an output electrode, and a common electrode, a series resonating piezoelectric crystal device having first and second terminals with the first terminal thereof connected to a reference potential, tank circuit means resonate at an overtone of the series resonant frequency of the said crystal device, circuit means connecting said tank circuit means between said second terminal of said crystal device and said input electrode, said tank circuit having a tap point thereon, means connecting said tap point to said common electrode to provide a first feedback path from said common electrode through said tank circuit to said crystal device, first resistor means bridging said tank circuit to lower the effective impedance of said first feedback path, circuit means including second resistor means connected between said common electrode and said reference potential to provide a second feedback path therethrough, means for applying a potential to said output electrode of said device, and means providing a low impedance to the overtone frequency connected between said output electrode and the reference potential, with feedback being provided from said output electrode to said common electrode through said first and second paths, said first path having less effective impedance to the feedback signal than said second path, said second feedback path providing insufficient feedback for sustaining oscillations at the frequency of said tank circuit means.

4. An oscillator including in combination, an electron device having an input electrode, an output electrode and a common electrode, a piezoelectric crystal device having a first terminal connected to a reference potential and having a second terminal, tank circuit means resonant at an overtone of the series resonant frequency of said crystal device, said tank circuit means having a tap thereon, circuit means coupling said tank circuit between said second terminal and said input electrode, means coupling said tap on said tank circuit to said common electrode, circuit means including inductor means adapted to be self-resonating at said overtone frequency shunted by feedback resistor means connecting said common electrode to the reference potential, said feedback resistor being of a selected low value to provide insufficient feedback to sustain oscillations, resistor means connected across said tank circuit to lower the effective impedance thereof to provide a feedback path between said common electrode and said second terminal having less impedance than said feedback resistor means to sustain oscillations in said crystal device, means for applying a potential to said output electrode, and means having a low impedance to the overtone frequency connected between said output electrode and the reference potential, whereby feedback is provided from said common electrode through a first path including said feedback resistor and through a second path including said crystal device and said tank circuit.

5. An oscillator circuit including in combination, an electron device having an input electrode, an output electrode, and a common electrode, a series resonating piezoelectric crystal device having first and second terminals with the first terminal thereof connected to a reference potential, tank circuit means resonate at an overtone of the series resonant frequency of the said crystal device, circuit means connected said tank circuit means between said second terminal of said crystal device and said input electrode, said tank circuit having a tap point thereon, means connecting said tap point to said common electrode to provide a first feedback path from said common electrode through said tank circuit to said crystal device to sustain oscillations therein, first resistor means bridging said tank circuit to lower the effective impedance of said first feedback path, circuit means including second resistor means connected between said common electrode and said reference potential to provide a second feedback path therethrough, said second feedback path providing insufficient feedback for sustaining oscillations at the frequency of said tank circuit means, and means providing a low impedance to the overtone frequency connected between said output electrode and the reference potential, with feedback being provided from said output electrode to said common electrode through said first and second paths.

References Cited in the file of this patent

UNITED STATES PATENTS

| | | |
|---|---|---|
| 2,455,824 | Tellier et al. | Dec. 7, 1948 |
| 2,506,762 | Antalek | May 9, 1950 |